USOO9797927B2

(12) United States Patent
McTigue

(10) Patent No.: US 9,797,927 B2
(45) Date of Patent: Oct. 24, 2017

(54) BROWSER PROBE

(71) Applicant: Keysight Technologies, Inc., Minneapolis, MN (US)

(72) Inventor: Michael T. McTigue, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 257 days.

(21) Appl. No.: 14/603,826

(22) Filed: Jan. 23, 2015

(65) Prior Publication Data
US 2016/0216320 A1 Jul. 28, 2016

(51) Int. Cl.
| G01R 31/02 | (2006.01) |
| G01R 1/06 | (2006.01) |
| G01R 1/067 | (2006.01) |
| H01R 13/24 | (2006.01) |
| H01R 11/18 | (2006.01) |
| G01R 1/18 | (2006.01) |

(52) U.S. Cl.
CPC ..... *G01R 1/06788* (2013.01); *G01R 1/06705* (2013.01); *H01R 11/18* (2013.01); *G01R 1/18* (2013.01)

(58) Field of Classification Search
CPC ...... G01R 31/02; G01R 31/2889; G01R 1/06; G01R 1/067; H01R 13/24
USPC ................ 324/72.5, 149, 754, 758; 439/700
See application file for complete search history.

(56) References Cited

U.S. PATENT DOCUMENTS

| 5,898,299 A * | 4/1999 | Fodali ............... G01R 1/04 324/149 |
| 6,967,473 B1 * | 11/2005 | Reed ............... G01R 1/06788 324/149 |
| 2001/0001537 A1 * | 5/2001 | McNulty ........... G01R 1/06777 324/72.5 |
| 2003/0173944 A1 * | 9/2003 | Cannon ............. G01R 1/06772 324/72.5 |
| 2005/0079771 A1 * | 4/2005 | DeLessert ........ G01R 1/06772 439/700 |
| 2006/0267602 A1 * | 11/2006 | Yang ............... G01R 1/06788 324/755.02 |

(Continued)

OTHER PUBLICATIONS

Office Action dated Sep. 1, 2016 in Chinese Application No. 201520455093.7 (Unofficial/non-certified translation provided by foreign agent included).

(Continued)

*Primary Examiner* — Son Le
*Assistant Examiner* — Neel Shah

(57) ABSTRACT

A browser probe has a probe body including a signal line, a nose of electrical insulating material integral with and projecting from the probe body, a pin supported by the probe body and electrically conductively connected to the signal line, a spring exerting a biasing force on the pin, an electrically conductive probe tip supported by the nose at a distal end of the nose remote from the probe body, and a plurality of discrete resistors interposed between the pin and the probe tip within the nose. The resistors are supported independently of another so as to be slidable within the nose. The probe tip is electrically conductively connected to the signal line via the resistors and the pin under the biasing force exerted by the spring.

20 Claims, 8 Drawing Sheets

(56) References Cited

U.S. PATENT DOCUMENTS

2007/0229099 A1* 10/2007 Campbell .......... G01R 1/06755
                                                    324/755.01
2013/0328549 A1* 12/2013 Liu .................... G01R 1/06788
                                                    324/149

OTHER PUBLICATIONS

Office Action dated Sep. 1, 2016 in Chinese Application No. 201620054738.0 (Unofficial/non-certified translation provided by foreign agent included).
Office Action dated Dec. 26, 2016 in Chinese Application No. 201620054738.0 (Unofficial/non-certified translation provided by foreign agent included).
Tektronix P75PDPM Precision Differential Probing Module, product specification, Jan. 22, 2015.
Tektronix P7500 Series TriMode Probes Technical Reference, service manual, Jan. 22, 2015.
Keysight Technologies, E2675A 6 GHz Differential Browser Kit for InfiniiMax Probes, product specification, Jan. 22, 2015.
Keysight Technologies, N5445A InfiniiMax III browser head, product specification, Jan. 22, 2015.
LeCroy WaveLink Series Differential Probe (13-25 GHz), operator's manual, Jan. 22, 2015.
Office Action dated May 17, 2016 in Chinese Application No. 201520455093.7 (Unofficial/non-certified translation provided by foreign agent included).

* cited by examiner

BROWSER PROBE

BACKGROUND

Representative embodiments relate to the testing of an electronic product, component, circuit or the like. In particular, representative embodiments are of test probes that may create temporary electrical connections to a device under test (DUT).

Electronic products typically include a circuit board or substrate bearing circuitry of the product. During the prototyping or throughout the course of the manufacturing of an electronic product electrical characteristics of the product are tested to ensure proper design of the product or to monitor the manufacturing processes. For example, in characterizing and troubleshooting electronic circuits there is a need to connect nodes of a circuit to measuring instrumentation such as an oscilloscope. This can be accomplished by establishing temporary electrical connections to the nodes. Different methods exist to accomplish this such as fixtured access which entails providing a controlled impedance line exiting the device under test (DUT)), temporarily solder-connecting a probe to the nodes, and contacting the nodes with a browser probe.

A browser probe is a device by which temporary connections to circuit nodes can be established quickly, and which can be moved easily to other nodes. This is where the name "browser" comes from—the ability to browse around circuit nodes of a DUT.

SUMMARY

A representative embodiment of a test probe has a probe body including a signal line, a nose of electrical insulating material integral with and projecting from the probe body, a pin supported by the probe body and electrically conductively connected to the signal line, a spring exerting a biasing force on the pin, an electrically conductive probe tip supported by the nose at a distal end of the nose remote from the probe body, and a plurality of discrete resistors interposed between the pin and the probe tip within the nose. The resistors are supported independently of another so as to be slidable within the nose. The resistors are also electrically conductively connected to one another, to the pin and to the probe tip, and the probe tip is electrically conductively connected to the signal line via the resistors and the pin under the biasing force exerted by the spring.

A representative embodiment of a test probe also has a probe body including a signal line, and an electrically conductive shield extending around the signal line, a nose of electrical insulating material projecting from the probe body and detachably mounted to the shield such that the nose can be detached from the probe body and attached back onto the probe body, a pin supported by the probe body and electrically conductively connected to the signal line, a spring exerting a biasing force on the pin, an electrically conductive probe tip supported by the nose at a distal end of the nose remote from the probe body, and at least one discrete resistor disposed within the nose as interposed between and electrically conductively connected to the pin and the probe tip. Each resistor is supported so as to be slidable within the nose. Also, the probe tip is electrically conductively connected to the signal line via the resistor(s) and the pin under the biasing force exerted by the spring.

A representative embodiment of a test probe also has a probe body including a pair of laterally spaced apart signal lines, and an electrically conductive shield extending around the signal lines, and a pair of probe tip assemblies each including a nose of electrical insulating material connected to the shield of and projecting from the probe body, a pin supported by the probe body and electrically conductively connected to a respective one of the signal lines, a spring exerting a biasing force on the pin, an electrically conductive probe tip supported by the nose at a distal end of the nose remote from the probe body, and a plurality of discrete resistors disposed within the nose as interposed between the pin and the probe tip. The discrete resistors of each of the probe tip assemblies are electrically conductively connected to one another, to the pin and to the probe tip of the assembly. The probe tip is electrically conductively connected to the respective one of the signal lines via the resistors and the pin under the biasing force exerted by the spring.

DETAILED DESCRIPTION

Figure 1:
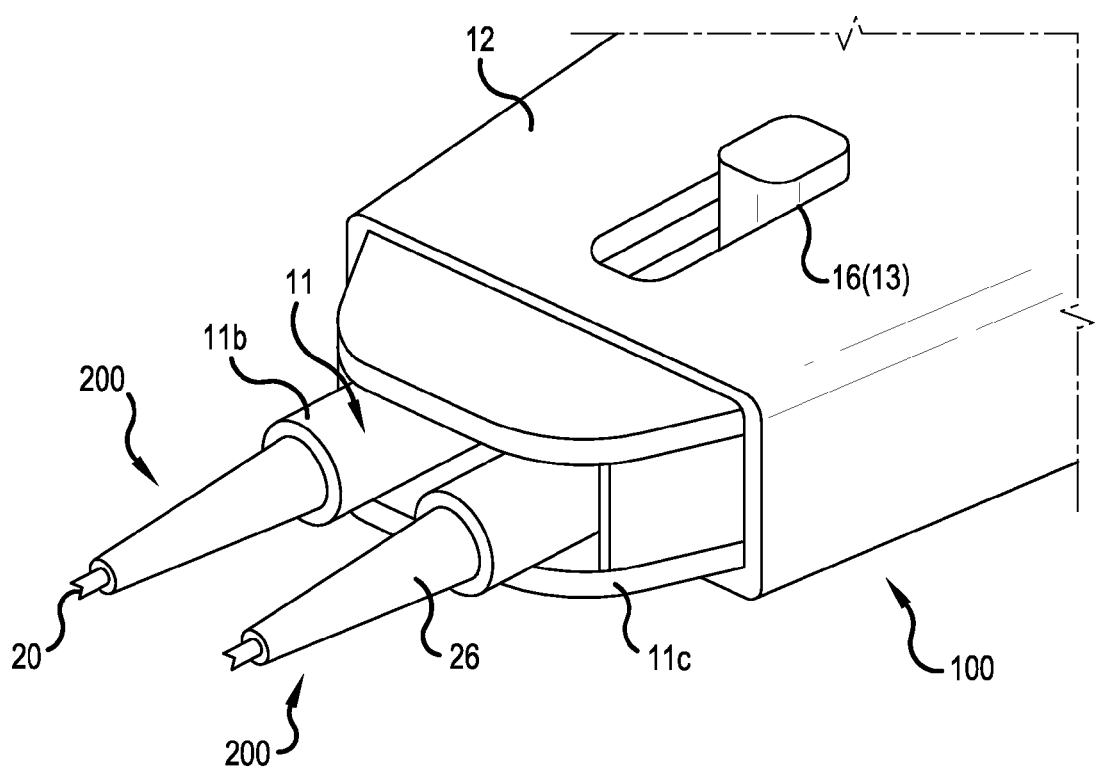
FIG. 1 is a perspective view of a representative embodiment of a browser probe.

In the following detailed description, for purposes of explanation and not limitation, representative embodiments disclosing specific details are set forth in order to provide a thorough understanding of the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art may be used in accordance with the representative embodiments.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

As used herein, the statement that two or more parts or components are "coupled" shall mean that the parts are joined or operate together either directly or indirectly, i.e., through one or more intermediate parts or components, so long as a link occurs. As used herein. "directly coupled" means that two elements are directly in contact with each other. As used herein, "fixedly coupled" or "fixed" means that two components are coupled so as to move as one while maintaining a constant orientation relative to each other.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein. These directional phrases are intended to encompass different orientations of an element in addition to the orientation depicted in the drawings. For example, if an element were inverted with respect to the view in the drawings, an element described as "above" another element, for example, would now be "below" that element. Similarly, if an element were rotated by 90° with respect to the view in the drawings, an element described "above" or "below" another element would now be "adjacent" to the other element; where "adjacent" means either abutting the other element, or having one or more layers, materials, structures, etc., between the elements.

Like numbered elements in these figures are either equivalent elements or perform the same function. Elements which have been discussed previously will not necessarily be discussed in later figures if the function is equivalent.

Representative embodiments of test probes will now be described in detail with reference to the attached figures.

Figure 2:
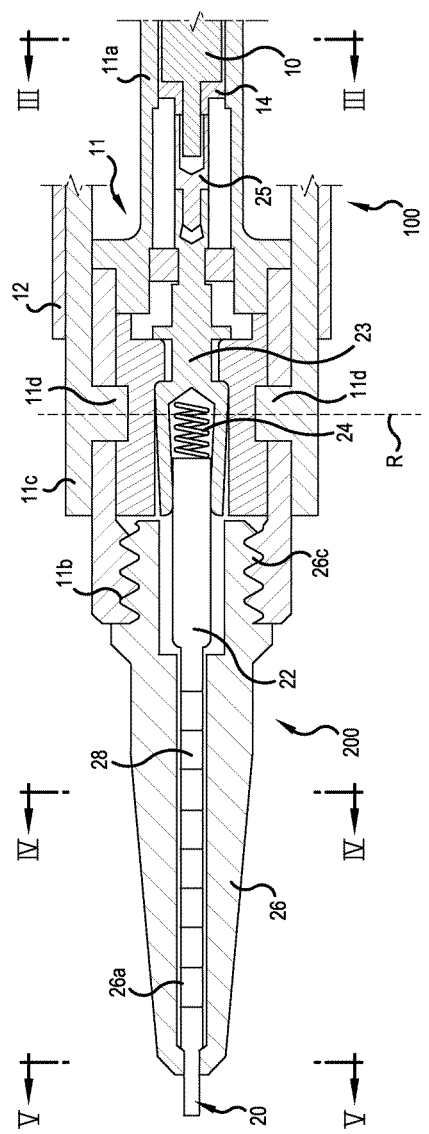
FIG. 2 is a partially broken-away longitudinal sectional view of the browser probe.
Figure 3:
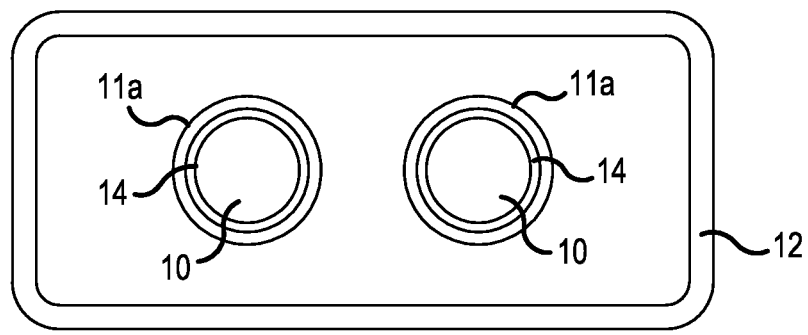
FIG. 3 is a cross-sectional view taken along line III-III of FIG. 2.
Figure 4:
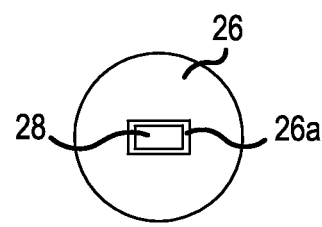
FIG. 4 is a cross-sectional view taken along line IV-IV of FIG. 2.

Referring first to FIGS. 1-3, a test probe includes a probe body 100 and a probe tip assembly 200 integral with the probe body 100. The probe body 100 includes a signal line 10, and the probe tip assembly 200 includes an electrically conductive probe tip 20 (e.g., a gold-plated member) for contacting a test point (e.g., circuit node) of a device under test (DUT) and transmitting a signal from the test point to the signal line 10.

The representative embodiment shown in FIGS. 1-8 is a browser probe in which the probe body 100 includes two signal lines 10, and a shield 11, which is electrically conducting, and which has two probe tip assemblies 200 integral with the probe body 100. The probe body 100 of this representative embodiment may also include an insulating housing 12 extending around the shield 11, and a span-adjusting mechanism 13 operable to adjust a span of the electrically conductive probe tips 20 (as will be described in more detail later on with reference to FIGS. 1 and 8).

In addition, in this representative embodiment, the probe body 100 comprises coaxial cables each having a core constituting a respective one of the signal lines 10, an electrically conductive ground shield 11a extending around the core, and insulating dielectric 14 interposed between the core and the electrically conductive ground shield 11a. The electrically conductive ground shields 11a of the coaxial cables make up at least part of the shield 11 of the probe body 100.

Referring to FIGS. 1, 2 and 4-6, each probe tip assembly 200 also includes an electrically conductive pin 22, a spring 24 exerting a biasing force on the electrically conductive pin 22, a nose 26 of electrical insulating material (e.g., plastic) connected to the shield 11 of and projecting from the probe body 100, and at least one resistor 28 interposed between the electrically conductive pin 22 and the electrically conductive probe tip 20. The nose 26 has a distal end, remote from the probe body 100, and at which the nose 26 supports the electrically conductive probe tip 20.

In the representative embodiment, a plurality of discrete resistors 28 are disposed within the nose 26 as interposed between the electrically conductive pin 22 and the electrically conductive probe tip 20. The electrically conductive pin 22 and spring 24 may constitute a pogo pin which further includes a support 23 having an open-ended hollow section in which the spring 24 is disposed. The support 23 guides the electrically conductive pin 22 so as to be slidable in an axial direction of the probe tip assembly 200. The resistors 28 are supported independently of one another and each of the resistors 28 is slidable within the nose 26 in the axial direction of the probe tip assembly 200. Furthermore, the resistors 28 are electrically conductively connected to one another, to the electrically conductive pin 22 and to the electrically conductive probe tip 20. Also, the electrically conductive probe tip 20 is electrically conductively connected to the signal line 10 via the resistors 28 and the electrically conductive pin 22 under the biasing force exerted by the spring 24. In this respect, the support 23 of the pogo pin in the representative embodiment is of electrically conductive material and engages the electrically conductive pin 22 to establish the electrical connection between the electrically conductive probe tip 20 and the signal line 10. Furthermore, the resistors 28 of each probe tip assembly 200 are disposed directly adjacent to each other, i.e., are in contact with each other, in an end-to-end arrangement.

Figure 7:
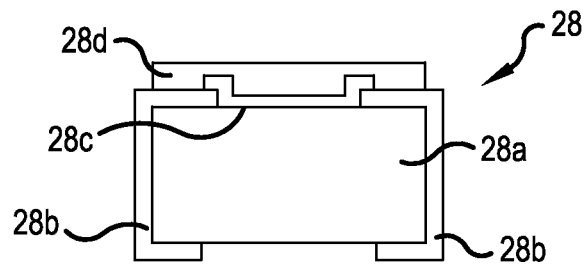
FIG. 7 is a schematic sectional view of an example of a resistor of the browser probe.

FIG. 7 shows an example of a resistor 28 of probe tip assembly 200. In this example, the resistor 28 is an SMD resistor or what is commonly referred to as a surface mount resistor. The SMD resistor has a ceramic (e.g., Alumina) substrate 28a, thin conductive films (a plating comprising Au, Ag, or Sn, for example) serving as conductors 28b on opposite ends of the ceramic substrate 28b, and a resistive element 28c spanning the conductors 28b along a major surface of the substrate 28a. An electrically insulating cover or 28d bearing identifying information, such as the resistance value, may be provided over the resistive element 28c to encapsulate the resistive element. Thus, in an example of the representative embodiment in which the discrete resistors 28 are SMD resistors, a conductor 28b of each SMD resistor is disposed against a conductor 28b of each SMD resistor adjacent thereto such that the resistors 28 are electrically connected in series, and the electrically conductive pin 22 contacts a conductor 28b of the resistor 28 closest to the probe body 100. The biasing force of the spring 24 maintains the contact between the resistors 28. Accordingly, the resistors 28 provide a resistance, between the electrically conductive probe tip 20 and a signal line 10, which is the sum of the resistance values of the resistors 28. And, although the spring 24 is schematically illustrated as a coil spring, other types of springs such as elastomeric elements may be used instead.

Figure 5:
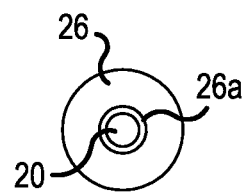
FIG. 5 is a cross-sectional view taken along line V-V of FIG. 2.

FIG. 3 shows an SMD resistor disposed within nose 26 of a probe tip assembly 200. In this example, the nose 26 has a generally conical shape and a passageway 26a extending axially therethrough. A section of the passageway 26a between the electrically conductive probe tip 20 and electrically conductive pin 22, and in which the resistors 28 are confined, may have a generally rectangular cross section complementary to the outer circumferential shape of SMD resistors. Thus, the SMD resistors are guided by the nose 26 within the passageway 28a for movement in the axial direction of the nose 26 which, in this example, coincides with the axial direction of the probe tip assembly 200. On the other hand, as shown in FIG. 5, a section of passageway 28a at the distal end of the nose 26 may have a circular cross section complementary to the outer circumferential shape of part of the pin of the electrically conductive probe tip 20 which projects from the nose 26. Thus, the electrically conductive probe tip 20 is also guided by the nose 26 within the passageway 28a for movement in the axial direction of the probe tip assembly 200.

The cross-sectional of the passageway 26a extending through the nose 26 and the outer circumferential shapes of the resistors 28 and the electrically conductive probe tip 20 shown in the figures and described above are exemplary only, though. That is, in this representative embodiment, the passageway 26a may have any cross-sectional shape(s) depending on the shapes of the resistors 28 and electrically conductive probe tip 20.

A resistor very near the tip of a browser probe can effect low non-resonant loading. This minimizes the un-damped capacitance due to the conductive (metal) probe tip. However, the capacitance across a resistor provided adjacent the tip of a browser can make it difficult to achieve a high fidelity probe response because high frequency current will tend to flow through the capacitance of the resistor instead of through the resistance and cause significant peaking. There are two basic ways to limit this effect: a resistor having a relatively low resistance value can be employed to thereby cause more high frequency current to flow through the resistance, or a relatively long resistor can be employed to minimize the end-to-end capacitance of the resistor. Using a resistor having a lower resistance value will cause the mid-band input impedance of the probe to be lower thereby increasing the mid-band loading. Employing a relatively long resistor does reduce the end-to-end capacitance of the resistance but compromises the durability of the browser at its tip because stable resistive materials are typically brittle. In other words, the longer the resistor the more susceptible the resistor is to breaking.

A representative embodiment using multiple resistors in series, as described above, can limit the effect of end-to-end capacitance by effectively lengthening the resistor without compromising the strength and durability of the browser at its tips. The values of the resistors and the number can be optimized to minimize end-to-end capacitance that causes peaking while maximizing the bandwidth.

Furthermore, the browser probe may exhibit a low inductance to achieve high bandwidth. For a single-ended probe this is the inductance of the loop created by the connection: signal probe tip to ground of the probe, then from the ground of the probe to the DUT ground via a ground probe tip. For a differential probe (having two signal probe tips) this is the inductance of the loop created by the connection: + signal probe tip to probe ground on + side, + side ground to − side ground, and then − side ground to − side signal probe tip.

In addition, if the browser flexes, as may occur at the nose 26, the resistors 28 may slide along one another at their ends without breaking. The nose 26 may be fabricated from a high quality polymer to ensure that it does not break when flexed. Also, the resistance is not severed due to the biasing force of the spring 24 that maintains the contacting state of the resistors 28.

Figure 6:
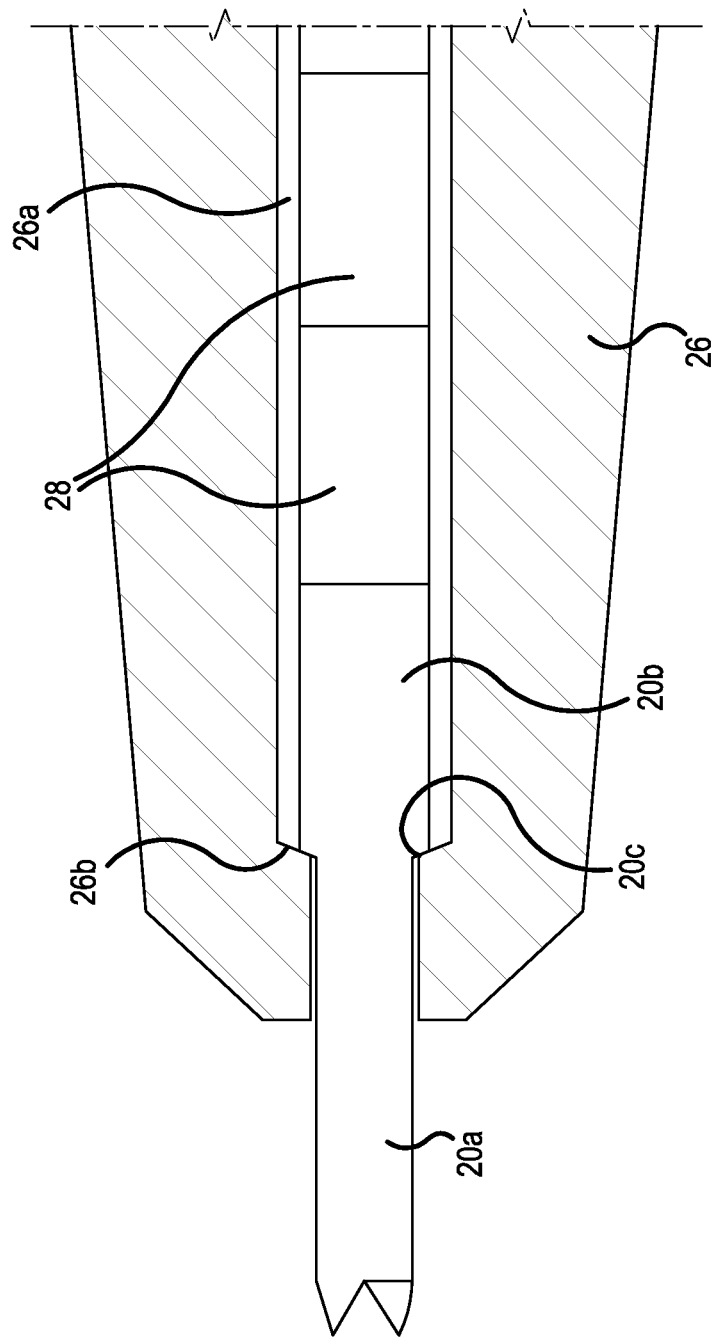
FIG. 6 is an enlarged view of a distal end portion of the browser probe.

Referring now to FIG. 6, the nose 26 may also have an internal shoulder 26b that delimits the passageway 26a at the distal end of the nose 26. The electrically conductive probe tip 20 may have a first end portion 20a, a second end portion 20b and an external shoulder 20c between the first and second end portions 20a, 20b.

The first end portion 20a may come to at least one point for contact with a test point of a DUT, e.g., may have a crown at its end as best shown in FIG. 6 or may come to a single point. In any case, a tip of the browser probe may thus be characterized as "narrow" and "pointy" as opposed to "brunt" or "bulky". A width of the electrically conductive probe tip 20 at its external shoulder 20c is greater than the minimum width of the passageway 26a at the internal shoulder 26b of the nose 26. In a non-testing position of the probe tip assembly 200 shown in FIGS. 1, 2 and 6 in which the electrically conductive probe tip 20 is not engaged, the biasing force of the spring 24 urges the external shoulder 20c of the electrically conductive probe tip 20 against the internal shoulder 26b of the nose 26 such that the electrically conductive probe tip 20 is retained within the nose 26.

Along with the nose 26, the electrically conductive probe tip 20 forms a "needle-like" tip that extends well past the probe body 100 of the browser so that the tip can access hard to reach test points, allows for good visibility of the connection between the test point and the electrically conductive probe tip 20, contributes to the ability of the probe to achieve a high bandwidth through its small geometry, and allows for the simultaneous use of multiple browsers to probe adjacent sets of test points.

Also, with an arrangement as described above, the electrically conductive probe tip 20 is provided with Z-axis compliance, namely, compliance in the axial direction of the probe tip assembly 200. When attempting to place the probe tips of a browser probe against the test points on a DUT, any side-to-side movement of the browser probe will cause one or the other probe tip to lift off the DUT. By providing Z-axis compliance, namely, some compliance in the direction along which the probe is pressed towards the DUT, the probe tips may remain in contact with the DUT despite some side-to-side movement of the browser probe. Furthermore, the electrically conductive probe tip 20 will only retract into the nose 26 until it is flush with the end of the nose. At this point, the nose 26 takes any further load and protects the resistors 28 and pogo pin from additional compressive loads.

In addition, as mentioned above, in the representative embodiment of FIGS. 1-8, the probe body 100 includes shield 11 extending around the signal lines 10. The nose 26 of electrically insulating material is secured directly to the shield 11. To this end, the nose 26 may be of plastic and may be threaded to the shield 11 such that the nose 26 can be removed from the shield and screwed back onto the shield 11.

For example, the shield 11 may have an internally threaded end section 11b integral with the electrically conductive ground shield 11a of the coaxial cable. The nose 26 has external threads which mate with the internal threads of the internally threaded end section 11b of the shield 11 such that the nose 26 can be screwed onto and unscrewed from the shield 11.

Accordingly, this facilitates the assembling or replacement of part of the probe. In particular, the electrically conductive probe tip 20, plastic nose 26, resistors 28, and pogo pin can be a replaceable assembly that is screwable to the coax for easy assembly or replacement. In addition, a select part or parts, such as one or more resistors 28, may be readily replaced or swapped out.

Figure 8:
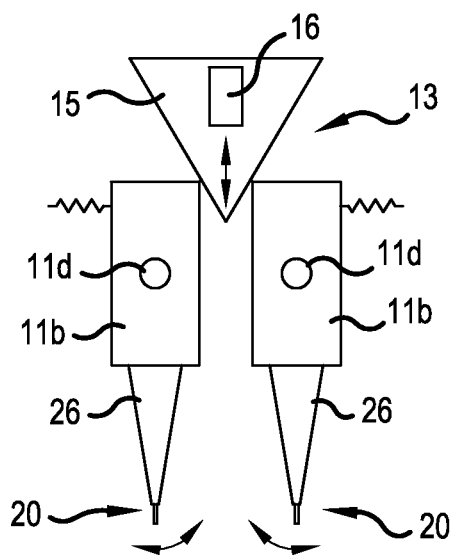
FIG. 8 is a schematic diagram of one example of a span-adjusting mechanism of the browser probe.

One example of the span-adjusting mechanism 13 by which a distance between the electrically conductive probe tips 20 of the probe tip assemblies 200 can be adjusted will now be described in detail with reference to FIGS. 1, 2 and 8. Because the distance between the probe tips can be adjusted the probe can accommodate for different spacings of probe test points on a DUT.

In this example, the shield 11 may also include a covering 11c wrapped by the insulating housing 12. The covering 11c and hence, the insulating housing 12, supports the internally threaded end sections 11b of the shield that are integral extensions of the electrically conductive ground shields 11a of the coaxial cables. In particular, the internally threaded end sections 11b are independently supported such that at least one of the internally threaded end sections 11b is swingable about an axis of rotation R. In the example shown in FIGS. 1, 2 and 8, both of the integral extensions of the ground shields 11, namely, the internally threaded end sections 11b of the shield, are supported in the probe so as to be swingable about respective axes of rotation parallel to each other. In this respect, the probe tip assemblies 200 may have additional components which allow the internally threaded end sections 11b to move or bend relative to the core of the coaxial cable that may be rigid or semi-rigid. For example, with reference to FIG. 2, probe tip assembly 200 may include an electrically conductive swivel joint 25 that connects the core of the coaxial cable to the support 23 of the pogo pin. FIG. 2 also shows various bushings (not numbered) by which the support 23 is supported by and within the shield 11. The swivel joint 25 not only electrically conductively connects the support 23 of the pogo pin to the core but allows for limited bending of the internally threaded end section 11b of the shield 11 relative to the core.

Moreover, pins 11d may be provided to support each internally threaded end section 11b of the shield for rotation about axis R. The pins 11d may be integral with top and bottom plates of the covering 11c of the shield 11 and extend into corresponding openings in the internally threaded end section 11b of the shield. Alternatively, the pins 11d may be integral with the internally threaded end sections 11b of the shield, the pins 11d may be discrete elements, or other forms of rotatable support may be used instead of the pins.

In any case, in this example of the representative embodiment, the noses 26 of the internally threaded end sections 11b of the shield 11 are supported in the test probe so as to be swingable relative to the other about a respective axis of rotation. Also, the span-adjusting mechanism 13 has a cam element 15 that engages the internally threaded end sections 11b and is reciprocatable to swing the noses 26 about the axes of rotation and thereby adjust the span between the electrically conductive probe tips 20 of the probe tip assemblies. In FIGS. 1 and 8, reference numeral 16 designates a thumb slide that is integral with the cam element 15 and protrudes from the insulating housing 12, and by which a technician can operate the span-adjusting mechanism 13. Also, FIG. 8 shows the internally threaded end sections 11b biased against the cam element 15, which biasing may be self-induced due to resilience in the electrically conductive ground shields 11a or which may be provided by springs.

Figure 9:
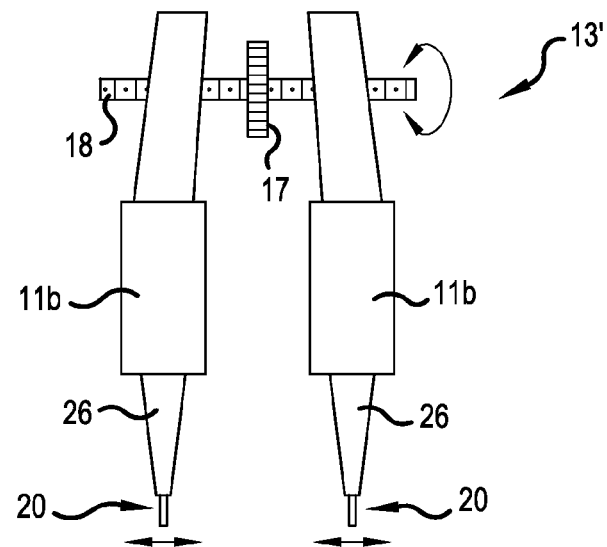
FIG. 9 is a schematic diagram of another example of a span-adjusting mechanism of the browser probe.

FIG. 9 shows another example of a span-adjusting mechanism 13'. In this example a thumbwheel 17 protrudes from the insulating housing 12 and a threaded rod 18 is integral with the thumbwheel 17 at its center. The threaded rod 18 is also threadingly engaged with the internally threaded end sections 11b of the shield 11. Rotation of the thumbwheel 17 thus rotates the threaded rod 18, and spreads the electrically conductive probe tips 20 apart or brings the electrically conductive probe tips 20 closer to one another. That is, in this example, the span-adjusting mechanism 13' may move the electrically conductive probe tips 20 linearly relative to each other. Alternatively, though, the threaded engagement between the threaded rod 18 and the internally threaded end sections 11b and the span-adjusting mechanism 13', in general, may be configured to cause the noses 26 to swing about axes of rotation, respectively, similar to the span-adjusting movement provided by the spin-adjusting mechanism 13 of FIG. 8.

Figure 10:
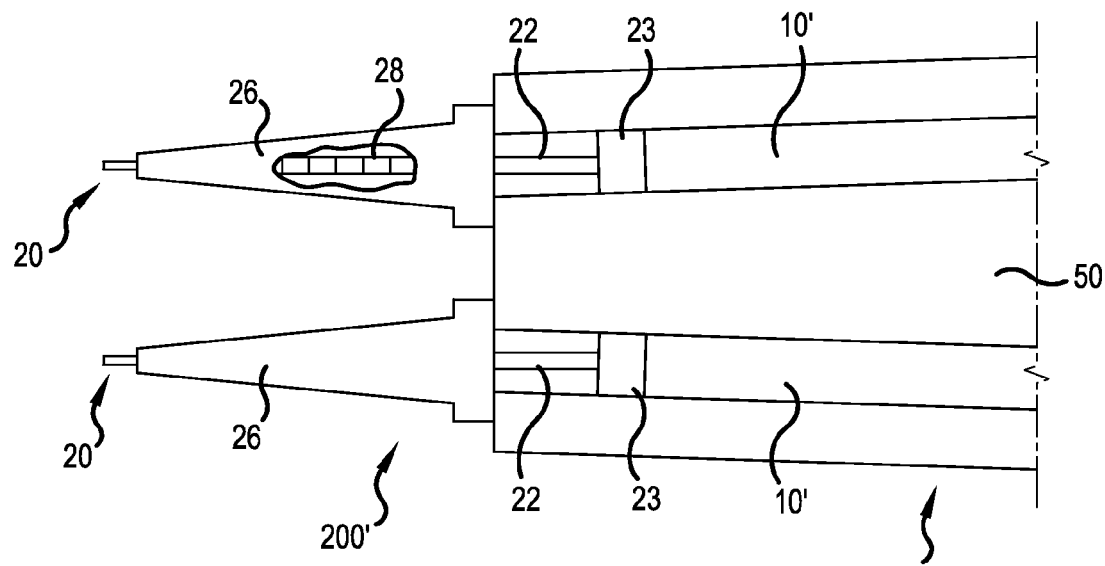
FIG. 10 is a schematic plan view, partially broken-away, of another representative embodiment of a browser probe.

FIG. 10 shows another representative embodiment of a test probe. In this representative embodiment, the test probe is a browser probe having a probe body 100' and probe tip assemblies 200'. The probe body 100' of this embodiment includes an insulating substrate 50, and signal lines 10' in the form of micro-strips of electrically conductive material extending on the substrate 50. For example, the substrate 50 may have trenches therein, and the signal lines 10' may electrically conductive material filling the trenches. The probe tip assemblies 200' may be similar to the probe tip assemblies 200 as each including (refer to FIGS. 1 and 2) a nose 26 of electrically insulating material, an electrically conductive pin 22 and spring biasing the pin, an electrically conductive probe tip 20 supported by the nose 26 at a distal end thereof, and discrete resistors 28 interposed between the electrically conductive pin 22 and the electrically conductive probe tip 20.

Figure 11:
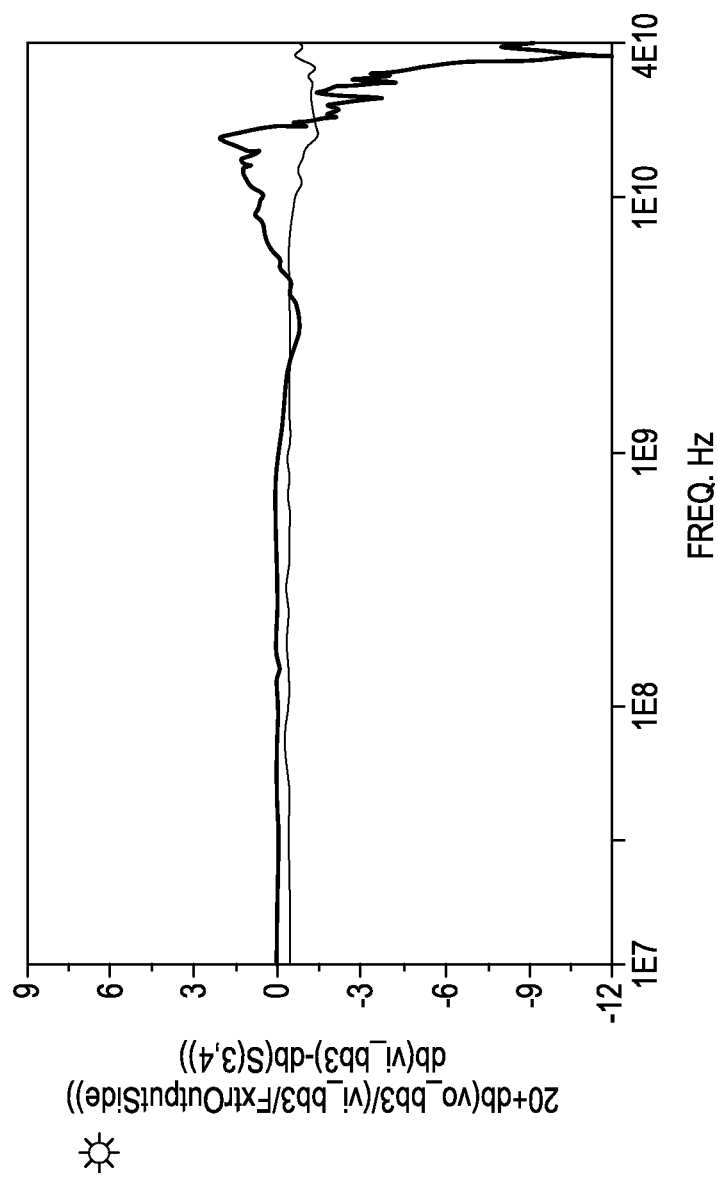
FIGS. 11 and 12 are graphs of performance characteristics of the representative embodiment of FIG. 10.
Figure 12:
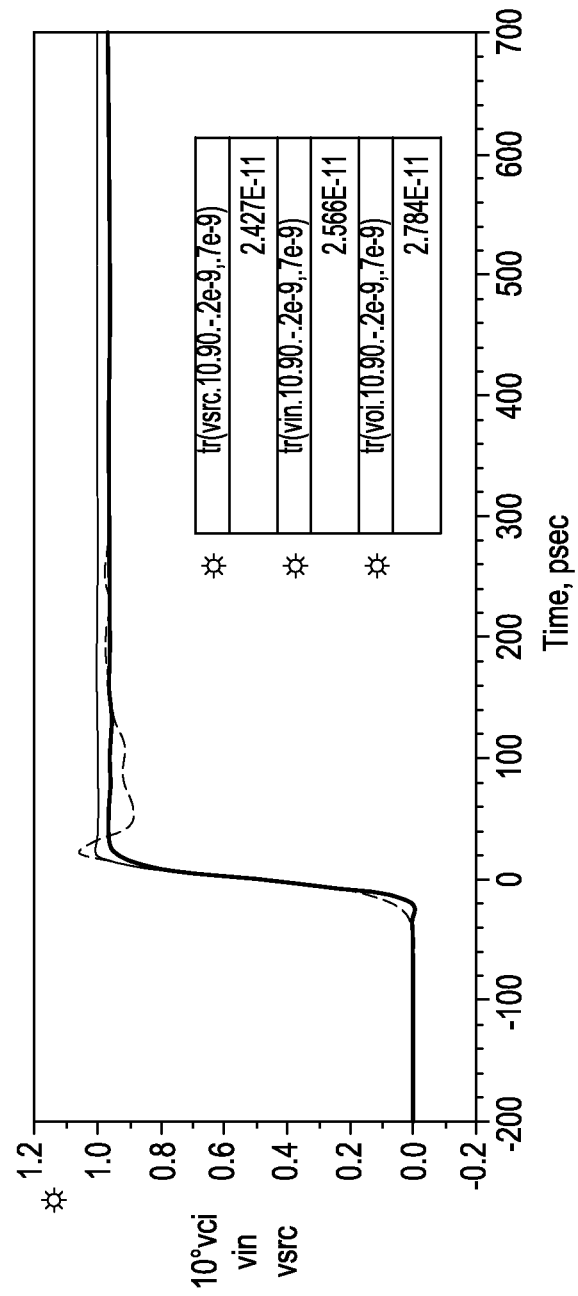

The stacking of discrete resistors of this representative embodiment allows for the total resistance to be distributed over a distance as desired in order to optimize the response. All the resistance in too short of a distance will typically exhibit excess end-to-end capacitance and frequency peaking. All the resistance spread over too long of a distance will exhibit excess series inductance and limit the BW. In an example of this representative embodiment that was bread boarded, eight 56.2 ohm 0201 resistors were used to create a 450 ohm distributed resistance which achieved a mid-band input impedance of 500 ohms on each side. As shown in the graphs of FIGS. 11 and 12, the browser probe exhibited a very flat response (non resonant and centered about its 20 db or 10:1 attenuation) and a bandwidth of greater than 20 GHz.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A test probe comprising: a probe body including a signal line; a nose of electrical insulating material integral with and projecting from the probe body; a pin supported by the probe body and electrically conductively connected to the signal line, and a spring exerting a biasing force on the pin; an electrically conductive probe tip supported by the nose at a distal end of the nose remote from the probe body; and a plurality of discrete resistors interposed between the pin and the probe tip within the nose, and wherein the resistors are supported independently of one another so as to be slidable within the nose, the resistors are electrically conductively connected to one another, to the pin and to the probe tip, and the probe tip is electrically conductively connected to the signal line via the resistors and the pin under the biasing force exerted by the spring.

2. The test probe as claimed in claim 1, wherein the probe body comprises a coaxial cable, the signal line is a core of the cable, and the nose is supported by a ground shield of the coaxial cable that extends around the core.

3. The test probe as claimed in claim 1, wherein the nose has an internal shoulder at said distal end, and
the probe tip has an external shoulder that along with the internal shoulder of the nose retains the probe tip within the nose at the distal end of the nose.

4. The test probe as claimed in claim 1, wherein the probe body comprises an electrically conductive shield extending around the signal line, and the nose is secured directly to the shield.

5. The test probe as claimed in claim 4, wherein the nose is threaded to the shield such that the nose can be removed from the shield and screwed back onto the shield.

6. The test probe as claimed in claim 5, wherein the nose has an internal shoulder at said distal end, and the probe tip has an external shoulder that along with the internal shoulder of the nose retains the probe tip within the nose at the distal end of the nose.

7. A test probe comprising: a probe body including a signal line, and an electrically conductive shield extending around the signal line; a nose of electrical insulating material projecting from the probe body and detachably mounted to the shield such that the nose can be detached from the probe body and attached back onto the probe body; a pin supported by the probe body and electrically conductively connected to the signal line, and a spring exerting a biasing force on the pin; an electrically conductive probe tip supported by the nose at a distal end of the nose remote from the probe body; and at least one discrete resistor disposed within the nose as interposed between and electrically conductively connected to the pin and the probe tip, wherein said at least one resistor is supported so as to be slidable within the nose, and the probe tip is electrically conductively connected to the signal line via the at least one resistor and the pin under the biasing force exerted by the spring.

8. The test probe as claimed in claim 7, wherein the probe body comprises a coaxial cable, the signal line is a core of the cable, and the shield comprises a ground shield of the coaxial cable that extends around the core.

9. The test probe as claimed in claim 7, wherein the nose is threaded to the shield.

10. The test probe as claimed in claim 7, wherein the nose has an internal shoulder at the distal end, and
the electrically conductive probe tip has an external shoulder that along with the internal shoulder of the nose retains the electrically conductive probe tip within the nose at the distal end of the nose.

11. The test probe as claimed in claim 7, wherein the at least one resistor comprises a plurality of discrete resistors supported within the nose, independently of one another, and the discrete resistors are electrically conductively connected to one another.

12. A test probe comprising: a probe body including a pair of laterally spaced apart signal lines, and an electrically conductive shield extending around the signal lines; and a pair of probe tip assemblies each including a nose of electrical insulating material connected to the shield of and projecting from the probe body, a pin supported by the probe body and electrically conductively connected to a respective one of the signal lines, and a spring exerting a biasing force on the pin, an electrically conductive probe tip supported by the nose at a distal end of the nose remote from the probe body, and a plurality of discrete resistors slidably disposed within the nose as interposed between the pin and the probe tip, and wherein the discrete resistors of each of the probe tip assemblies are electrically conductively connected to one another, to the pin and to the probe tip of the assembly, and the probe tip is electrically conductively connected to the respective one of the signal lines via the resistors and the pin under the biasing force exerted by the spring.

13. The test probe as claimed in claim 12, wherein the probe body comprises a pair of coaxial cables,
the signal lines are cores of the cables, respectively, and
the shield comprises ground shields, of the coaxial cables, which extend around the cores, respectively.

14. The test probe as claimed in claim 12, wherein the noses of the probe tip assemblies are detachably mounted to the shield such that the noses can be detached from and attached back onto the probe body.

15. The test probe as claimed in claim 14, wherein the nose of each of the probe tip assemblies has an internal shoulder at said distal end, and
the probe tip of the assembly has an external shoulder that along with the internal shoulder of the nose retains the probe tip within the nose at the distal end of the nose.

16. The test probe as claimed in claim 14, wherein the noses are threaded to the shield.

17. The test probe as claimed in claim 14, wherein the probe body comprises a pair of coaxial cables,
the signal lines are cores of the cables, respectively, and
the shield comprises ground shields, of the coaxial cables, which extend around the cores, respectively.

18. The test probe as claimed in claim 12, wherein the probe body further comprises a span-adjusting mechanism to adjust a span between the probe tips of the probe tip assemblies.

19. The test probe as claimed in claim 18, wherein at least one of the noses is supported in the test probe so as to be swingable relative to the other about a respective axis of rotation, and
the span-adjusting mechanism is operable to swing said at least one nose about the axis of rotation to adjust the span between the probe tips of the probe tip assemblies.

20. The test probe as claimed in claim 18, wherein the probe body comprises a pair of coaxial cables, and a housing in which the coaxial cables extend,
the signal lines are cores of the cables, respectively,
the shield comprises ground shields, of the coaxial cables, which extend around the cores, respectively, and end sections integral with the ground shields and supported in the test probe so as to be movable relative to each other,
the noses of the probe tip assemblies are detachably connected to the shield at the end sections of shield integral with the ground shields of the coaxial cables, respectively, and
the span-adjusting mechanism is operable to move the end sections of the shield relative to each other to adjust the span between the probe tips.

* * * * *